United States Patent [19]

Ling

[11] Patent Number: 4,943,557
[45] Date of Patent: Jul. 24, 1990

[54] METHOD OF MAKING A HIGH DENSITY YBA $CU_3O_x$ SUPERCONDUCTOR MATERIAL

[75] Inventor: Hung C. Ling, Belle Mead, N.J.

[73] Assignee: AT&T Bell Laboratories, Murray Hill, N.J.

[21] Appl. No.: 232,418

[22] Filed: Aug. 15, 1988

[51] Int. Cl.$^5$ .................... C01B 13/00; C01F 17/00; C01G 3/02; C04B 35/00
[52] U.S. Cl. ........................................ 505/1; 252/518; 252/521; 423/604; 423/635; 501/123; 502/341; 502/346; 505/742; 505/780
[58] Field of Search ................ 501/123; 502/346, 341; 423/604, 635; 505/1; 252/518, 521

[56] References Cited

PUBLICATIONS

"Proceedings and Superconducting Properties of Perovskite Oxides," by J. M. Tarascon et al., pp. 498–505, Advanced Ceramic Materials, vol. 2, No. 3B Special Issue, 1987.
"Synthesis, Characterization, and Fabrication of High Temperature Superconducting Oxides," by E. C. Behrman et al., pp. 539–555, Avanced Ceramic Materials, vol. 2, No. 3B, Special Issue, 1987.
Tien "Hot Isostatic Pressing (HIP) for the Densification of Oxide Superconductors"; *Supercond. Its Appl., Proc. Annu. Conf. Super. Appl.* 2nd, 1988 pp. 73–76.
Rauhala "Ion Beam Analysis of Oxygen Distribution in . . . $YBa_2Cu_3O_x$" *Appl. Phys. Lett.* vol. 52(18) May 2, 1988, pp. 1520–1522.
Matthews "Increased Transition Temperatures in $YBa_2Cu_3O_y$ . . . " *Nature* vol. 328, Aug. 27, 1987, pp. 786–787.
Shyu "Annealing Effects on Properties of High $T_c$ $YBa_2Cu_3O_7$" *Mat. Res. Soc. Symp. Proc.* vol. 99, Nov.–Dec. 1987, pp. 655–658.
Voigt "A Hydroxycarbonate Route to Superconductor Precursor Powders" *Mat. Res. Soc. Symp. Proc.*, vol. 99, Nov.–Dec. 1987, pp. 635–638.
Beech "Neutron study of the crystal structure . . . $Ba_2YCu_3O_{9-\delta}$" *Physical Review B* vol. 35, No. 16, Jun. 1, 1987, pp. 8778–8781.
Kuwabara "Preparation of High-$T_c$ Superconducting Y-Ba-Cu-O Ceramics . . . " *Jap. Jnl. Appld. Physics* vol. 26, No. 11, Nov. 1987, pp. L1821–L1823.
Patel "Electrical, Mechanical and Ultrasonic Properties of a" Advanced Ceramic Materials vol. 2, No. 3B, Special Issue, Jul. 1987, pp. 615–623.
Taylor "Sintering time and temperature for $Ba_2YCu_3O_{7-x}$" *MRS Symp. Proceeding: High $T_c$–Super.* vol. 99, Dec. 1987, pp. 663–666.
Nakahara "On the Defect Structure of Grain Boundaries in $Ba_2YCu_3O$" *Mat. Res. Soc. Symp. Proc.* vol. 99, Dec. 1987, pp. 575–578.
Parmigiani "Observation of Carboxylic Groups in the Lattice of . . . $Ba_2YCu_3O$" *Physical Rev. B* vol. 36, No. 13, Nov. 1987, pp. 7148–7150.
Uno "Synthesis of Superconductive Oxides by Vacuum Calc." *Jap. Jnl. Appld. Phys.* vol. 27, No. 6, Jun. 1988, pp. L1003–L1006.

*Primary Examiner*—Paul Lieberman
*Assistant Examiner*—John Boyd
*Attorney, Agent, or Firm*—Robert B. Levy

[57] ABSTRACT

In a process for making the superconductive composition $YBa_2Cu_3O_x$, cupric carbonate or cupric oxalate is used as the copper source and barium carbonate as the barium source to achieve higher densification.

5 Claims, No Drawings

METHOD OF MAKING A HIGH DENSITY YBA CU₃Oₓ SUPERCONDUCTOR MATERIAL

BACKGROUND OF THE INVENTION

This invention relates to superconductor materials and more particularly to methods of making superconductor compositions having the formula $YBa_2Cu_3O_x$.

The scientific literature has recently described many new compositions which display superconductivity at temperatures above the liquid nitrogen temperature. When such compositions are cooled to the liquid nitrogen temperature, they essentially display a zero resistance to electrical current and therefore offer the possibility of dramatic improvements in such apparatus as transmission lines and electromagnetic coils. One promising superconductive ceramic composition has the formula $YBa_2Cu_3O_x$, where x may vary between 6.5 and 7.0, depending upon the processing procedure used for making the composition. Many workers have experimented with ways for formulating this composition, have assessed its characteristics, and have described in the scientific literature the results they have obtained; one example of such literature is the paper, "Synthesis, Characterization and Fabrication of High Temperature Superconducting Oxides," by E. C. Behrman et al., "Advanced Ceramics Materials," Vol. 2, No. 3B, Special Issue, 1987, p. 539.

While $YBa_2Cu_3O_x$ is commercially promising because it becomes superconductive at temperatures higher than the liquid nitrogen temperature, it is a rather porous ceramic material that is not easily worked. It has been recognized that if this composition could be made more dense (i.e., less porous), it would be mechanically stronger and have less propensity to fracture. Other advantages that would be obtained by increased densification would be increased chemical stability, increased current density, and increased reliability.

SUMMARY OF THE INVENTION

A superconductor composition of $YBa_2Cu_3O_x$ is made by mixing together compounds of yttrium, barium and copper, calcining the mixture to form the composition $YBa_2Cu_3O_x$, milling or grinding the calcined composition, and sintering the composition to form it into a solid ceramic substance. In accordance with the invention, the compound of copper which constitutes the source of copper for the composition is either cupric carbonate or cupric oxalate.

As will become clear later, by using cupric carbonate or cupric oxalate as the copper source for $YBa_2Cu_3O_x$, one achieves a significantly higher densification of the completed composition than would otherwise be possible.

These and other objects, advantages and features of the invention will be better understood from a consideration of the following detailed description taken in conjunction with the accompanying drawing.

DRAWING DESCRIPTION

FIGS. 1 and 2 show graphs of linear shrinkage versus sintering time for various compositions of $YBa_2Cu_3O_x$ with sintering temperatures of 960° C. and 990° C., respectively.

DETAILED DESCRIPTION

The superconducting ceramic composition $YBa_2Cu_3O_x$ is normally made by inducing a solid state reaction of a barium compound such as barium carbonate ($BaCO_3$), yttrium oxide ($Y_2O_3$) and cupric oxide (CuO). After sintering, these compositions are formed into solid structures but their density is nevertheless invariably quite low, varying between 60 and 85% of the theoretical density of the composition. The theoretical density is that which would occur with a molecular structure uninterrupted by pores in the structure. By using cupric oxalate or cupric carbonate as the source for copper in the composition, I have found that the porosity of the composition is dramatically reduced and that the actual density of the composition can be increased to well over 90% of its theoretical density.

The importance of the copper source in making $YBa_2Cu_3O_x$ can be appreciated from the following discussion of experiments in such compositions made from different sources. In these experiments, $BaCO_3$ was used solely as the source of barium because, with other well-known barium sources, such as $Ba(OH)_2$, water cannot be used as the mixing and milling medium. For the other metal ions of the composition, copper and yttrium, the oxide, carbonate or oxalate of these metals was chosen as the source and constituted one major variable. Table I shows the sources used in making eight sample lots of $YBa_2Cu_3O_x$, each lot being designated with an E followed by four digits. Thus, sample lot E 1305 was made using cupric oxide as the copper source and yttrium oxide as the yttrium source.

TABLE I

| cupric/yttrium source | yttrium oxide $Y_2O_3$ | yttrium carbonate $Y_2(CO_3)_3 \cdot 3H_2O$ | yttrium oxalate $Y_2(C_2O_4)_3 \cdot 9H_2O$ |
| --- | --- | --- | --- |
| cupric oxide CuO | E 1305 | | E 1314 |
| cupric carbonate | E 1309 | E 1330 | E 1306 |
| cupric oxalate $Cu(C_2O_4) \cdot 0.5H_2O$ | E 1328 | E 1331 | E 1329 |

A standard ceramic-processing procedure was adopted for all of the experiments. Appropriate weight ratios of $BaCO_3$ and the cupric and yttrium ion sources were mixed in a 1000 milliliter plastic bottle and were ball-milled for four hours in deionized water using a zirconia ($ZrO_2$) milling medium. This granulates the mixture into a slurry. The water was then removed from the slurry by filtering and by drying at 125° C. for 16 hours. The dried mix was then granulated through a 20 mesh screen. Approximately 100 gram batches were next calcined by heating at 900° C. for two hours, cooled, granulated and re-calcined at 900° C. for another two hours. The calcined powder was granulated using a mortar and pestle prior to compaction. Lot E 1305 was also calcined at 950° C. for 16 hours. This powder was subjected to a four-hour secondary ball-milling with zirconia balls and isopropanol.

The samples were next dry-pressed from the powders in the form of 1.27 centimeter (0.5 inch) diameter discs, 0.64 centimeter (0.25 inch) diameter discs, or rectangular bars measuring 0.32 centimeter (0.125 inch) in width and 1.27 centimeter (0.5 inch) in length, the pressing being under an average pressure of 165.4 MN (24,000 psi) or 103.4 MN (15,000 psi). The samples were heated at a rate of 400° C. per hour to a temperature of 960° C. or 990° C. and sintered for five minutes, one hour, three hours or 12 hours. All the sintering runs were followed by annealing at 500° C. for two hours, and slow cooling to room temperature. The variation in sintering temperature and time constituted another major variable.

The geometrical densities were determined from the weight and physical dimensions of the samples after sintering. For certain samples, liquid displacement was used to determine volume, using carbon tetrachloride as the liquid. The superconductor qualities of all of the samples were verified.

The maximum densities of the different sample lots for samples sintered for 12 hours at 990° C. are given in Table II. The table shows that the use of cupric carbonate as the copper source resulted in consistently high densities of about 6.00 gm/cm$^3$, or greater than 93% of the theoretical density. The use of cupric oxalate as a copper source also gave densities of between 5.70 and 5.93 gm/cm$^3$ or between 90% and 93% of the theoretical density. The single asterisks designate density computation by liquid displacement, while the double asterisks indicates density computation by geometric measurement. The maximum density achieved at 960° C. with sample E 1306 was 5.85 gm/cm$^3$, or 92% of the theoretical density.

TABLE II

| Sample lot | density (gm/cm$^3$) | $p/p_{th}$ (%) |
|---|---|---|
| E 1309 | 6.01* | 94.6 |
| E 1330 | 5.92* | 93.2 |
| E 1306 | 6.03* | 95.0 |
| E 1328 | 5.93* | 93.4 |
| E 1331 | 4.23** | 66.6 |
| E 1329 | 5.73* | 90.2 |
| E 1305 | 3.70** | 58.3 |
| E 1314 | 4.53** | 71.3 |

Another useful parameter for demonstrating densification is the linear shrinkage during sintering. FIGS. 1 and 2 show the linear shrinkage of disc samples as a function of sintering time for sintering temperatures of 960° C. and 990° C., respectively. The legend on the figures shows the designation on the graph for each of the samples defined in Table I. Thus, curves 10 and 11 of FIG. 1 show linear shrinkage of samples made from cupric carbonate, curves 12 and 13 show linear shrinkage of samples made from cupric oxalate, and curve 14 is for samples made from cupric oxide. In FIG. 2, curves 16 and 17 indicate cupric carbonate, 18 indicates cupric oxalate, and 19 and 20 indicate cupric oxide. Curve 16 also indicates the case of cupric oxalate in combination with yttrium oxide. For all of the samples, the shrinkage increased with sintering time during the first two hours, reaching a saturated value after about four to six hours at the sintering temperature and with the cupric carbonate samples, the change in length or linear shrinkage was about −16% for 960° C., and about −19% for the 990° C. sintering temperature. The graphs also show a significant linear shrinkage with the cupric oxalate samples.

The figures make it clear that different variables have an effect on densification. For example, the compound used as the yttrium source has an effect. FIGS. 1 and 2, along with Table II, however, demonstrate not just an effect, but a dramatic increase in densification using cupric carbonate as the copper source, and a somewhat less, but still dramatic, densification using cupric oxalate as the copper source.

The various samples were composed of compound sources that were carefully proportioned in accordance with known stoichiometric principles so as to give a minimum of unreacted residue. Table III shows the number of grams and weight percents of each compound component of the samples tested that used cupric carbonate or cupric oxalate sources.

TABLE III

| Sample | Y Compound | | Ba Compound | | Cu Compound | |
|---|---|---|---|---|---|---|
| | gm | wt % | gm | wt % | gm | wt % |
| E 1309 | 112.90 | 13.25 | 394.70 | 46.31 | 344.70 | 40.44 |
| E 1306 | 301.91 | 28.99 | 394.70 | 37.90 | 344.70 | 33.11 |
| E 1330 | 205.90 | 21.78 | 394.70 | 41.75 | 344.70 | 36.47 |
| E 1328 | 112.90 | 10.73 | 394.70 | 37.53 | 544.13 | 51.74 |
| E 1329 | 301.91 | 24.33 | 394.70 | 31.81 | 544.13 | 43.86 |
| E 1331 | 205.90 | 17.99 | 394.70 | 34.48 | 544.13 | 47.53 |

In all cases, the cupric carbonate used was of a type assayed to contain a minimum of 55% copper, and is commercially available, for example, from the J. T. Baker Chemical Company, Phillipsburg, N.J. The cupric oxalate used had the formula Cu(C$_2$O$_4$).0.5H$_2$O and is commercially available, for example, from Stram Chemical Inc., Newburyport, Mass. The yttrium carbonate had the formula Y$_2$(CO$_3$)$_3$.3H$_2$O and is available, for example, from Alpha Products, Danbury, Mass. The yttrium oxalate had the formula Y$_2$(C$_2$O$_4$)$_3$.9H$_2$O and is available, for example, from Alpha Products. The yttrium oxide had the formula Y$_2$O$_3$, and the barium carbonate had the formula BaCO$_3$, both being available from Alpha Products.

In any commercially practical use of the process, the source compounds would first be granulated and mixed. It is useful to add water or alcohol to assist in the mixing but it is not essential. However, water cannot be used if a soluble source compound such as Ba(OH)$_2$ is used as the barium source. After mixing, the liquid is separated, either by filtering, in the case of water, or by evaporation, in the case of alcohol. Thereafter, the material is allowed to dry and is further mixed well.

Next, the mixture is calcined, preferably by heating at 850° C. to 925° C., although calcination temperatures as high as 950° C. are possible. Heating times are typically several hours as is known in the art. Either the source material or the ambience or both may be a source of oxygen during the solid state reaction that occurs during calcination. Thereafter, the reactive mixture is milled, either by dry milling or alcohol milling. The milled powder is pressed to make a structure and is then sintered by heating preferably between 900° C. and 1000° C. The compound melts at about 1025° C., which represents an upper limit. Sintering is preferably done in an oxygen atmosphere so as to increase the oxygen constituency and is done for typically 1–12 hours. Thereafter, the composition is preferably annealed at 450° C. to 650° C. for two hours to two days. The final compound has the formula YBa$_2$Cu$_3$O$_x$ where x approaches seven, and it is usually preferable to make the subscript as close to seven as possible, although compositions with an x of 6.5 have been shown to be useful superconductors.

It is believed that the foregoing specification has demonstrated the dramatic improvement in densification obtained by making the compound YBa$_2$Cu$_3$O$_x$ using a cupric carbonate or cupric oxalate source material, rather than cupric oxide as has been conventional in the prior art. Increased density makes possible increased mechanical strength, chemical stability and reliability of the composition. A preferred method for implementing the process as been described in some detail, and various modifications have been described. These descriptions, however, are intended to be only illustrative of the invention, and it is to be understood that various other modifications may be made by those skilled in the art without departing from the spirit and scope of the invention.

I claim:

1. A method of making a superconductor composition of $YBa_2Cu_3O_x$ comprising the steps of: mixing together a compound of yttrium, barium carbonate, and a compound of copper selected from the group consisting of cupric carbonate and cupric oxalate; calcining the mixture by heating it to a temperature of 850 to 950 degrees C.; milling the calcined material; pressing the milled and calcined material to a solid structure; sintering the solid structure in an oxygen-containing atmosphere at a temperature of 960 to 990 degrees C. for at least two hours; annealing the sintered structure at 400 to 600 degrees C. for a period of time from two hours to two days, thereby to obtain a structure of $YBa_2Cu_3O_x$ which has a density of a least 90.

2. The method of claim 1 wherein:
the calcining step comprises the step of heating the material to 850–950 degrees C. for approximately two hours, cooling it, granulating it, and reheating it to 850–950 degrees C. for approximately two hours.

3. The method of claim 1 wherein:
the sintering step comprises the step of heating the structure at 960–990 degrees C. in an atmosphere containing free oxygen for approximately twelve hours.

4. The method of claim 1 wherein:
The initial mixing comprises the steps of mixing the compounds with a liquid, milling the mixture, and removing the liquid by filtering and by drying the mixture.

5. The method of claim 1 wherein:
the compound of copper is cupric carbonate.

* * * * *

UNITED STATES PATENT AND TRADEMARK OFFICE
CERTIFICATE OF CORRECTION

PATENT NO. : 4,943,557
DATED : July 24, 1990
INVENTOR(S) : Hung C. Ling

It is certified that error appears in the above—identified patent and that said Letters Patent is hereby corrected as shown below: ON TITLE PAGE:

first column, in the title,
change "YBA $CU_3O_x$" to --$YBA_2CU_3O_x$--;

second column,
after "Attorney, Agent or Firm," change "Robert B. Levy" to --Roderick B. Anderson-- second column, last line,
after "5 Claims" change "No Drawings" to --1 Drawing Sheet--.

Column 1, line 2,
after "YBA" insert --$_2$--;

Column 2, line 20,
change "in" to --on--.

Column 6, line 2,
after "90" insert --%--.

The sheet of drawings consisting of figs. 1 and 2, should be added as shown on the attached sheet.

United States Patent [19]

Ling

[11] Patent Number: 4,943,557
[45] Date of Patent: Jul. 24, 1990

[54] METHOD OF MAKING A HIGH DENSITY YBA $CU_3O_x$ SUPERCONDUCTOR MATERIAL

[75] Inventor: Hung C. Ling, Belle Mead, N.J.

[73] Assignee: AT&T Bell Laboratories, Murray Hill, N.J.

[21] Appl. No.: 232,418

[22] Filed: Aug. 15, 1988

[51] Int. Cl.$^5$ .................... C01B 13/00; C01F 17/00; C01G 3/02; C04B 35/00
[52] U.S. Cl. .................... 505/1; 252/518; 252/521; 423/604; 423/635; 501/123; 502/341; 502/346; 505/742; 505/780
[58] Field of Search .............. 501/123; 502/346, 341; 423/604, 635; 505/1; 252/518, 521

[56] References Cited

PUBLICATIONS

"Proceedings and Superconducting Properties of Perovskite Oxides," by J. M. Tarascon et al., pp. 498–505, Advanced Ceramic Materials, vol. 2, No. 3B Special Issue, 1987.
"Synthesis, Characterization, and Fabrication of High Temperature Superconducting Oxides," by E. C. Behrman et al., pp. 539–555, Avanced Ceramic Materials, vol. 2, No. 3B, Special Issue, 1987.
Tien "Hot Isostatic Pressing (HIP) for the Densification of Oxide Superconductors"; *Supercond. Its Appl., Proc. Annu. Conf. Super. Appl.* 2nd, 1988 pp. 73–76.
Rauhala "Ion Beam Analysis of Oxygen Distribution in ... $YBa_2Cu_3O_x$," *Appl. Phys. Lett.* vol. 52(18) May 2, 1988, pp. 1520–1522.
Matthews "Increased Transition Temperatures in $YBa_2Cu_3O_y$ ..." *Nature* vol. 328, Aug. 27, 1987, pp. 786–787.
Shyu "Annealing Effects on Properties of High $T_c$ $YBa_2Cu_3O_7$" *Mat. Res. Soc. Symp. Proc.* vol. 99, Nov.–Dec. 1987, pp. 655–658.
Voigt "A Hydroxycarbonate Route to Superconductor Precursor Powders" *Mat. Res. Soc. Symp. Proc.*, vol. 99, Nov.–Dec. 1987, pp. 635–638.
Beech "Neutron study of the crystal structure ... $Ba_2YCu_3O_{9-\delta}$" *Physical Review B* vol. 35, No. 16, Jun. 1, 1987, pp. 8778–8781.
Kuwabara "Preparation of High-$T_c$ Superconducting Y-Ba-Cu-O Ceramics ..." *Jap. Jnl. Appld. Physics* vol. 26, No. 11, Nov. 1987, pp. L1821–L1823.
Patel "Electrical, Mechanical and Ultrasonic Properties of a" *Advanced Ceramic Materials* vol. 2, No. 3B, Special Issue, Jul. 1987, pp. 615–623.
Taylor "Sintering time and temperature for $Ba_2YCu_3O_{7-x}$" *MRS Symp. Proceeding: High $T_c$-Super.* vol. 99, Dec. 1987, pp. 663–666.
Nakahara "On the Defect Structure of Grain Boundaries in $Ba_2YCu_3O$" *Mat. Res. Soc. Symp. Proc.* vol. 99, Dec. 1987, pp. 575–578.
Parmigiani "Observation of Carboxylic Groups in the Lattice of ... $Ba_2YCu_3O$" *Physical Rev. B* vol. 36, No. 13, Nov. 1987, pp. 7148–7150.
Uno "Synthesis of Superconductive Oxides by Vacuum Calc." *Jap. Jnl. Appld. Phys.* vol. 27, No. 6, Jun. 1988, pp. L1003–L1006.

*Primary Examiner*—Paul Lieberman
*Assistant Examiner*—John Boyd
*Attorney, Agent, or Firm*—Robert B. Levy

[57] ABSTRACT

In a process for making the superconductive composition $YBa_2Cu_3O_x$, cupric carbonate or cupric oxalate is used as the copper source and barium carbonate as the barium source to achieve higher densification.

5 Claims, 1 Drawings

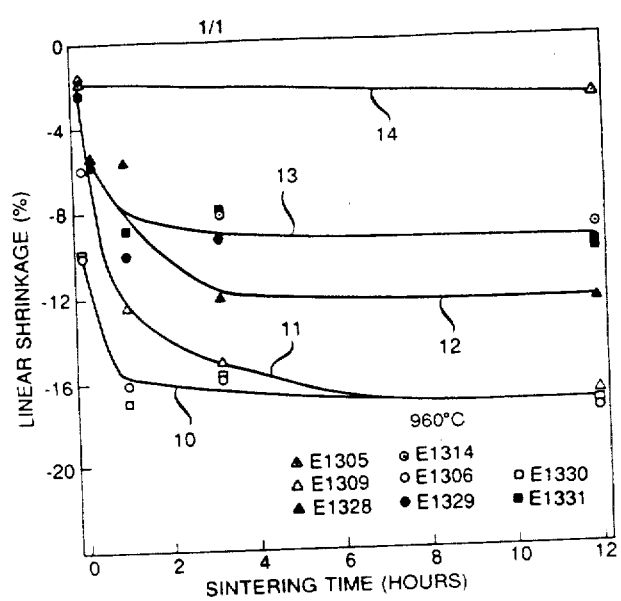

UNITED STATES PATENT AND TRADEMARK OFFICE
CERTIFICATE OF CORRECTION

Page 3 of 3

PATENT NO. : 4,943,557
DATED : July 24, 1990
INVENTOR(S) : Hung C. Ling

It is certified that error appears in the above-identified patent and that said Letters Patent is hereby corrected as shown below:

The sheet of drawings consisting of Figs. 1 and 2, should be added as shown on the attached page.

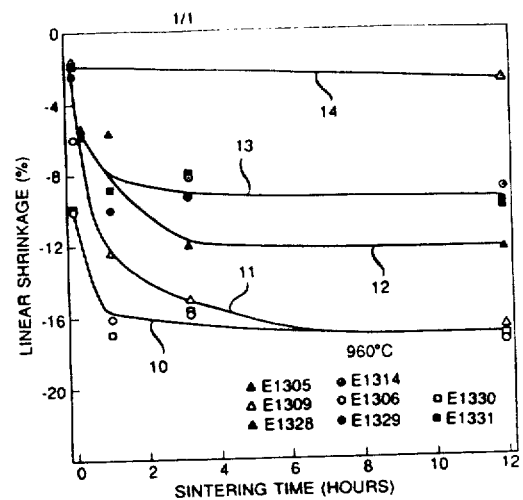

FIG. 1

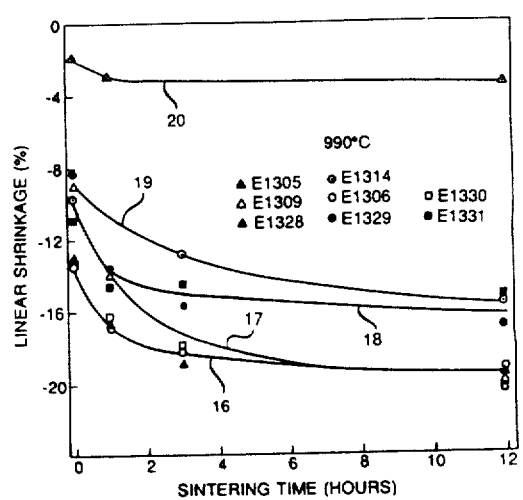

FIG. 2

Signed and Sealed this

Twenty-fifth Day of February, 1992

Attest:

HARRY F. MANBECK, JR.

*Attesting Officer*          *Commissioner of Patents and Trademarks*